Figure 1:
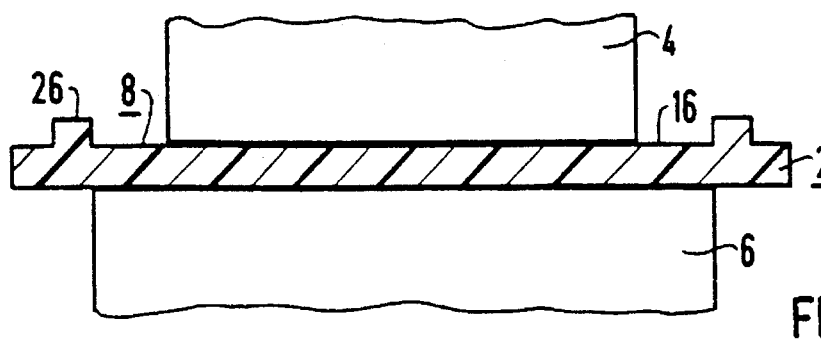

United States Patent [19]

Fuhrer et al.

[11] Patent Number: 5,576,578
[45] Date of Patent: Nov. 19, 1996

[54] HIGH VOLTAGE INSULATING DISK

[75] Inventors: Wolfgang Führer, Herzogenaurach; Olaf Niermeyer, Möhrendorf; György Papp, Erlangen, all of Germany

[73] Assignee: Siemens Aktiengesellschaft, München, Germany

[21] Appl. No.: 244,073

[22] PCT Filed: Dec. 13, 1991

[86] PCT No.: PCT/DE91/00973

§ 371 Date: May 16, 1994

§ 102(e) Date: May 16, 1994

[87] PCT Pub. No.: WO93/10560

PCT Pub. Date: May 27, 1993

[30] Foreign Application Priority Data

Nov. 15, 1991 [DE] Germany ............ 9114268 U

[51] Int. Cl.$^6$ .................. H01L 23/10; H01L 23/34
[52] U.S. Cl. ............ 257/706; 257/705; 257/707; 257/712; 257/713; 257/717; 257/718; 257/719; 257/721
[58] Field of Search ................. 257/706, 705, 257/707, 717, 721, 712, 719, 718, 713

[56] References Cited

U.S. PATENT DOCUMENTS

| | | | |
|---|---|---|---|
| 3,592,988 | 3/1971 | Pucher | 200/148 |
| 3,662,086 | 5/1972 | Hessinger | 257/712 |
| 4,703,339 | 10/1987 | Matsuo | 257/706 |

FOREIGN PATENT DOCUMENTS

| | | |
|---|---|---|
| 0408228 | 1/1991 | European Pat. Off. . |
| 0412545 | 2/1991 | European Pat. Off. . |
| 2369773 | 5/1978 | France . |
| 3740233 | 6/1989 | Germany . |
| 8614173.2 | 8/1989 | Germany . |
| 3937130 | 5/1990 | Germany . |
| 59-69951 | 4/1984 | Japan . |
| 61-51947 | 3/1986 | Japan . |
| 62-287649 | 12/1987 | Japan ............ 257/705 |
| 1042135 | 2/1989 | Japan . |
| 1032654 | 2/1989 | Japan ............ 257/705 |
| 2024514 | 1/1980 | United Kingdom . |
| WO8808615 | 11/1988 | WIPO . |

OTHER PUBLICATIONS

Patent Abstracts Of Japan, JP 1042135, Jun. 6, 1989.
Patent Abstracts Of Japan, JP 55024464, Apr. 25, 1980.
Patent Abstracts Of Japan, JP 61051947, Jul. 25, 1986.
Patent Abstracts Of Japan, JP 59069951, Aug. 14, 1984.
Patent Abstracts Of Japan, JP 56103435, Nov. 12, 1981.

*Primary Examiner*—Jerome Jackson
*Assistant Examiner*—Jhihan Clark
*Attorney, Agent, or Firm*—Kenyon & Kenyon

[57] ABSTRACT

An insulating disk composed of electrically insulating and thermally conducting material. The disk has one side provided with a central recess having a cross section which is equal to a cross section of a component arranged adjacent to the disk. Consequently, the value of the extinction voltage of the partial discharge and the creeping-discharge and flashover resistance are substantially increased. Circumferential grooves and/or ribs can also be provided on the surface of the disk.

9 Claims, 3 Drawing Sheets

HIGH VOLTAGE INSULATING DISK

The invention relates to an insulating disk composed of electrically insulating and thermally conducting material.

Such insulating disks are used in a liquid cooling of an electrical component, in particular a semiconductor component, which is disposed in an electrically insulating and thermally conducting manner on a heat sink, in particular a cooling box. In this situation, said insulating disk is introduced between cooling box and semiconductor component. In the case of such a thin insulating disk having plane-parallel surfaces, a partial discharge sets in early, creeping discharges form, and the flashover resistance is low and can hardly be increased by increasing the creepage path.

German Utility Model 86 14 173 discloses an insulating cell which is used for the double-sided cooling of presspack-cell semiconductors. Said insulating cell has a disk shape and resembles externally the standard disk semiconductors in its dimensions. The centerpiece is a beryllium oxide (BeO) disk approximately 3 mm thick which has high electrical insulation but good thermal conduction and which is flanked by two metal plates composed of material with good thermal conduction, preferably copper, for the purpose of good thermal contact and for protection. This arrangement is surrounded and held together by an epoxy resin extrusion. Said metal plates also have a smaller diameter than the diameter of the beryllium oxide disk and they additionally taper in the direction of the contact with the beryllium oxide disk. In addition, aluminum oxide (Al2O3) is also known as an insulating material. Although such an insulating cell is highly insulating, has very good thermal conduction and is insensitive to pressure, it is also of very expensive design.

German Offenlegungsschrift 37 40 233 discloses a cooling box for removing the heat loss from semiconductors which, if service water is used as cooling liquid, contains an insulating plate composed of inorganic insulating material. The cooling box comprises two shells having two connecting pipes for supplying and removing the cooling liquid, cooling ribs being disposed inside said shells, and contact plates for receiving the heat released by the semiconductor element and distributing it to the cooling liquid. The insulating plate composed of inorganic material is disposed between the contact plate and the shell. The diameter of the insulating plate is larger than the diameter of the shell and of the contact plate. To increase the creepage paths, the cooling box, with the exception of the contact surface and the hydraulic connections, is encased in plastic. Beryllium oxide (BeO) or aluminum oxide ($Al_2O_3$) is provided as inorganic material. In addition, the insulating plate has circular, solderable metallizations on both sides, these being smaller than the outside diameter of the insulating plate and equal to the diameter of the shell or the contact plate. As a result of this design of the cooling box, cooling can be carried out with normal water and no glow discharges, which occur in the case of insulating disks described at the outset (low glow-voltage strength), occur.

German Offenlegungsschrift 39 37 130 discloses a box cooling device for cooling electrical components, in which the cooling box is encased in a 1 mm to 3 mm thin insulating layer which comprises encapsulating and/or laminating resin composed of unsaturated polyester and/or epoxy resins (thermosetting plastic) and/or a modified polystyrene (thermoplastic material). The insulating layer is surrounded on the outside by a contact box having good electrical conductivity, for example a copper box. As a result of this design of the box cooling device, normal water can be used as cooling liquid and the compact construction permits a simple and rapid replacement. The contact box connects the two contact surfaces electrically, which is disadvantageous in individual cases.

The object of the invention is therefore to provide an insulating disk which no longer has the disadvantages cited.

This object is achieved according to the invention in that one side of said insulating disk is provided in the edge region with at least one circumferential rib and/or with at least one circumferential groove. This surface design of an insulating disk achieves the result that, for constant partial discharge value, the value of the flashover voltage is substantially increased. Consequently, the flashover resistance of an arrangement comprising two components separated from one another by means of said insulating disk can be increased substantially without increasing the diameter of said insulating disk at the same time. In addition, this object is achieved, according to the invention, in that one side of said insulating disk is provided centrally with a recess whose cross section is equal to a cross section of a component. Furthermore, the object is achieved, according to the invention, in that one side of said insulating disk is provided with a circumferential groove whose walls are conductively coated, and in that said circumferential groove is disposed in such a way that a cross-sectional area enclosed by the outer edge of the groove is at least larger than the cross-sectional area of a contact surface of a component.

Providing a recess on one side of the insulating disk achieves the result that a component, for example a semiconductor or a cooling box, can be countersunk in the thin insulating disk, as a result of which high marginal field intensities occur at the component in a material of higher breakdown strength (inorganic material, thermosetting plastic ). As a result, the threshold voltage for the partial discharge increases. In addition, this design of the insulating disk is particularly advantageous in the case of an arrangement of two components (an electrical component and a cooling box) whose cross sections are of different size.

The same advantages are achieved by means of the third insulating disc according to the invention, which is used in an arrangement of a disk semiconductor and a cooling box having disk-shaped cross-sectional area. In this case, that side of the component which is adjacent to the insulating disk can be of any desired shape provided it does not cross the outer edge of the groove.

In the case of the insulating disk having the recess, the depth or the thickness of the base of the recess can be varied until the breakdown strength given by the insulating material is reached at an edge of the recessed component. This minimizes the thermal resistance of said insulating disk.

The edge region of said insulating disk must be thick enough for the edge field strength around the countersunk component in the insulating disk to be reduced to a value which can be tolerated by the medium (air, oil, sealing material) which surrounds the insulating disk.

In an advantageous embodiment of the insulating disk, the cross section of the recess is larger by a gap dimension than the cross section of a countersinkable component and the side walls of said recess are conductively coated. This increases the partial-discharge resistance.

In a further advantageous embodiment of the insulating disk, the edge region is formed as a circumferential rib. This prominence in the region of the creepage path of the insulating disk increases the value of the flashover voltage substantially.

In an advantageous embodiment of the second insulating disk, the area enclosed by the circumferential groove is conductive and this conductive layer is connected in an electrically conducting manner to the conductive layer of the groove. This design prevents the partial discharges from forming at the contact areas between component and insulating disk. Instead of the conductive layer of the circumferential groove, said groove may also be filled with conducting material.

The value of the flashover voltage can also be substantially improved in the case of this second insulating disk by using ribs and grooves in the region of the creepage path.

Said value of the flashover voltage can be increased by approximating the cross-sectional shape of the grooves and ribs of the first or second insulating disk to the so-called Rogowski profile.

A further advantage of the first and second insulating disk in one of the cited embodiments of the surface is that the size of the insulating disk decreases without affecting the flashover resistance.

In order to explain the invention further, reference is made to the drawing, in which several embodiments of a first, second and third insulating disk are shown diagrammatically.

Figure 2:
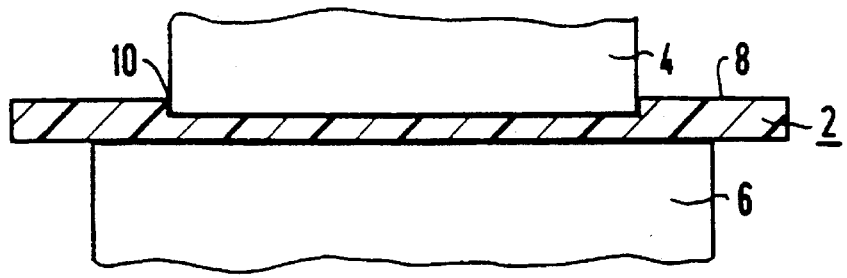
Figure 3:
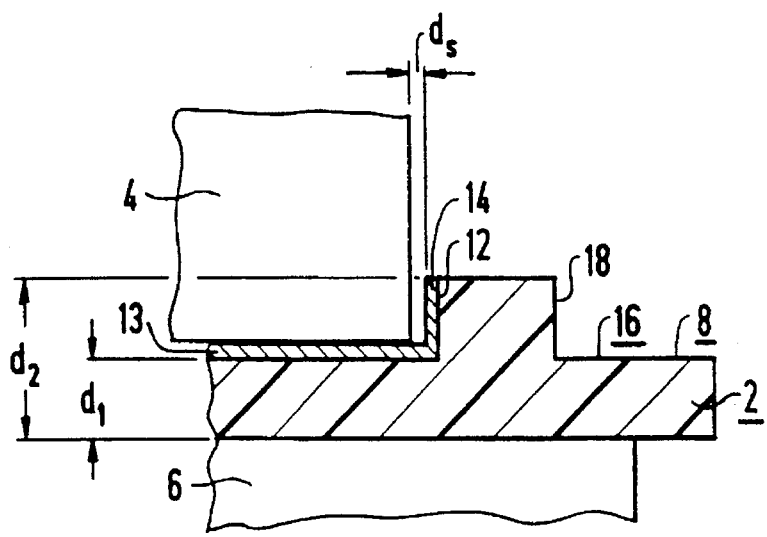
Figure 4:
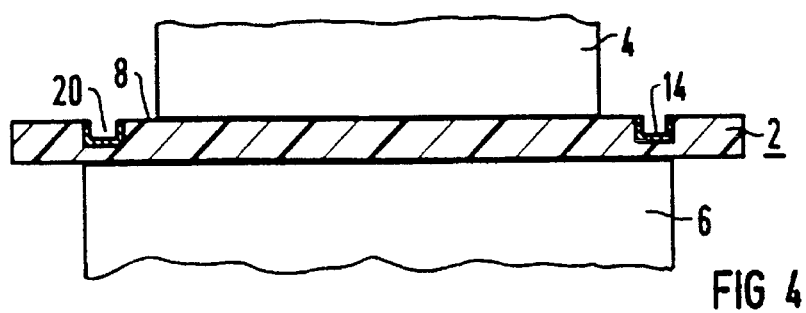

FIG. 1 illustrates a cross section of a first insulating disk according to the invention, FIG. 2 shows a cross section of a second insulating disk according to the invention, FIG. 3 shows an advantageous design of the insulating disk shown in FIG. 2, FIG. 4 shows a cross section of a third insulating disk according to the invention, and FIGS. 5 to 8 in each case show advantageous designs of the insulating disk shown in FIG. 4.

FIG. 1 shows a cross section through a first insulating disk 2 according to the invention, which is disposed between two components 4 and 6. Said insulating disk 2 is composed of electrically insulating and thermally conducting material. The material used can be inorganic ceramic, for example beryllium oxide (BeO), aluminum oxide ($Al_2O_3$), aluminum nitrite (AlN), silicon nitrite (SiN), thermoplastic materials, for example polystyrene, PA, PTFE, and thermosetting plastics, for example glass-fiber-reinforced epoxy resins. These materials may also be combined as desired by means of joining processes. The components 4 and 6 envisaged are semiconductors, in particular power semiconductors, and cooling boxes. One side 8 of said insulating disk 2 is provided with a circumferential rib 26, which is disposed in the edge region 16 of said insulating disk 2. Instead of this one circumferential rib 26, a circumferential groove 24 may also be provided. It is, however, also possible to design the side 8 of said insulating disk 2 in the edge region 16 in such a way that a plurality of circumferential ribs 26 and/or a plurality of circumferential grooves 24 are provided. The alternative proposals for this first insulating disk 2 according to the invention are not shown in greater detail for reasons of clarity.

FIG. 2 shows a cross section through a second insulating disk 2 according to the invention, which is likewise disposed between two components 4 and. 6. From the point of view of material, this second insulating disk 2 does not differ from the first insulating disk 2 shown in FIG. 1. The difference is in the surface design of the insulating disk 2. To countersink the component 4, which may be a semiconductor or a cooling box, one side 8 of the insulating disk 2 is provided with a recess 10. At the same time, the cross section of the recess 10 is equal to the cross section of the component 4 to be countersunk. By countersinking the component 4 in the thin insulating disk 2 the result is achieved that the high marginal field intensity at the component 4 occurs in a material of higher breakdown strength (insulating disk 2), as a result of which it has been possible to increase the threshold voltage for partial discharge. As a result of this simple design of a surface 8 of the insulating disk 2, it has been possible to achieve an rms value of 3 kV (minimum) as partial discharge voltage.

FIG. 3 shows a portion of an advantageous embodiment of the insulating disk 2 shown in FIG. 2 in greater detail. In this advantageous embodiment, the cross section of the recess 10 is larger by a gap dimension ds than the cross section of the component 4 and the walls 12 and the base 13 of the recess 10 are coated with a conductive layer 14. In addition, in this embodiment, the edge region 16 of the insulating disk 2 is formed as a circumferential rib 18 in such a way that said circumferential rib 18 also determines the dimensions of the recess 10. The thickness d2 of the edge region 16 may also decrease outwards, the contour of said edge region 16 resulting from the voltage division on the surface 8 of the edge region 16. The thickness d2 of the edge region 16 or the thickness d2 of the circumferential rib 18 has to be large enough for the edge field strength around the component 4 in the insulating disk 2 to be reduced to a tolerable value (2 . . . 3 kV/mm in the case of air) for the surrounding medium, normally air, oil or sealing material. The thickness d1 of the base 13 of the recess 10 can be reduced until the breakdown strength due to the insulating material is reached at the edge of the countersunk component 4. In addition, this minimized the thermal resistance of the insulating disk 2.

As a result of these surface measures in the case of an insulating disk 2, the result is achieved that a minimum required partial discharge voltage of 3 kV (rms value) is reached. This surface designed insulating disk 2 can be used particularly in components 4 and 6 whose cross-sectional areas are of different size.

FIG. 4 shows a cross section through a third insulating disk 2 according to the invention, which is disposed between two components 4 and 6. From the point of view of the material, said insulating disk 2 does not differ from the first insulating disk 2 shown in FIG. 1. The difference is in the surface design of the insulating disk 2. One side 8 of said insulating disk 2 is provided with a circumferential groove 20 whose walls are provided with a conductive layer 14. Instead of said conductive layer 14, the circumferential groove 20 may also be filled with a conductive material.

Figure 5:
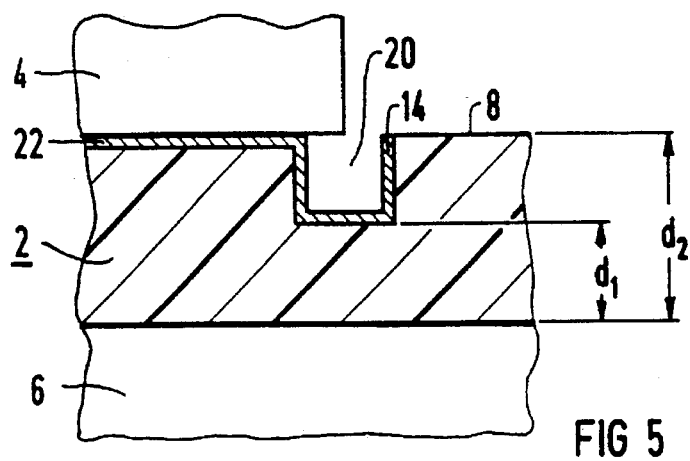
Figure 6:
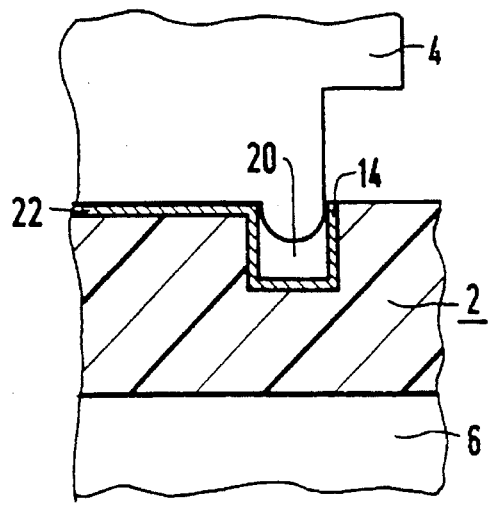

FIG. 5 shows an advantageous design of the third insulating disk 2 according to the invention shown in FIG. 4. In this advantageous design, the surface of the side 8 of the insulating disk 2, which is contacted by the component 4, is coated with a conductive layer 22. Said conductive layer 22 is connected in an electrically conducting manner to the conductive layer 14 of the circumferential groove 20. As a result of this additional conductive layer 22, partial discharges at the contact surfaces of the component 4 and the insulating disk 2 are prevented.

Compared with the embodiment of the second insulating disk 2, the thickness distribution of the third insulating disk 2 shown in FIG. 4 is as follows: in the region underneath the component 4, ie. the region enclosed by the circumferential groove, the insulating disk 2 has a thickness d2 similar to that of the insulating disk 2 shown in FIG. 2 in the edge region 16. The thickness d1 of the insulating disk 2 underneath the groove 20 may assume the same value as the thickness d1 of the base 13 of the recess 10 of the second insulating disk 2.

The third insulating disk 2 designed in this way is preferably used in the case of components 4 and 6 which have a disk-shaped cross-sectional area. In addition, the insulating disk 2 may be lapped to achieve certain values of parallelism and flatness of the surface without affecting the values for partial-discharge voltage and flashover voltage adversely.

In the case of the surface condition of the third insulating disk 2, the circumferential groove 20 should be laid around the component 4 in such a way that a cross-sectional area enclosed by the outer edge of the groove 20 is at least larger than the cross-sectional area of a contact surface of the component 4 (FIGS. 4 and 5). In addition, that side of the component 4 adjacent to the insulating disk 2 can be of any desired shape (FIG. 6), provided it does not cross the outer edge of the groove 20.

Figure 7:
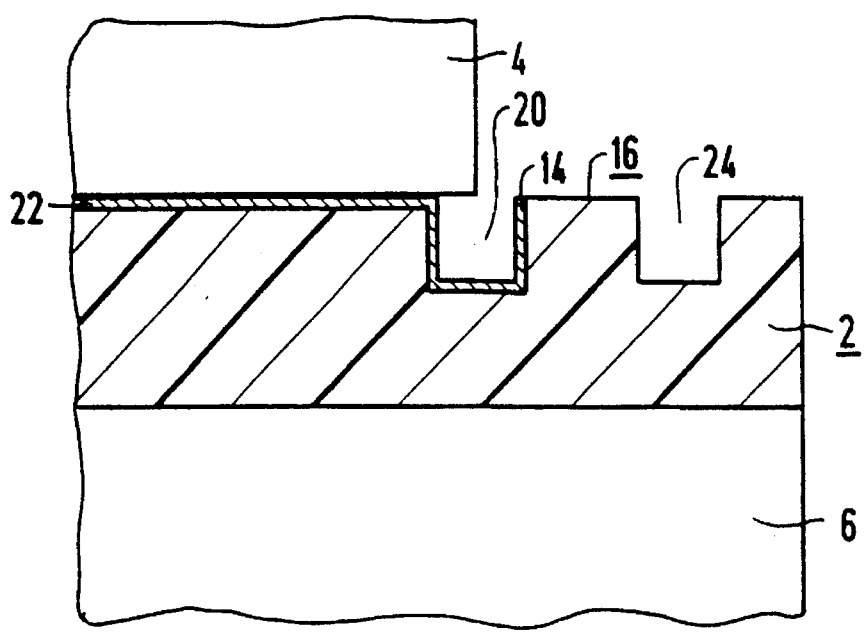
Figure 8:
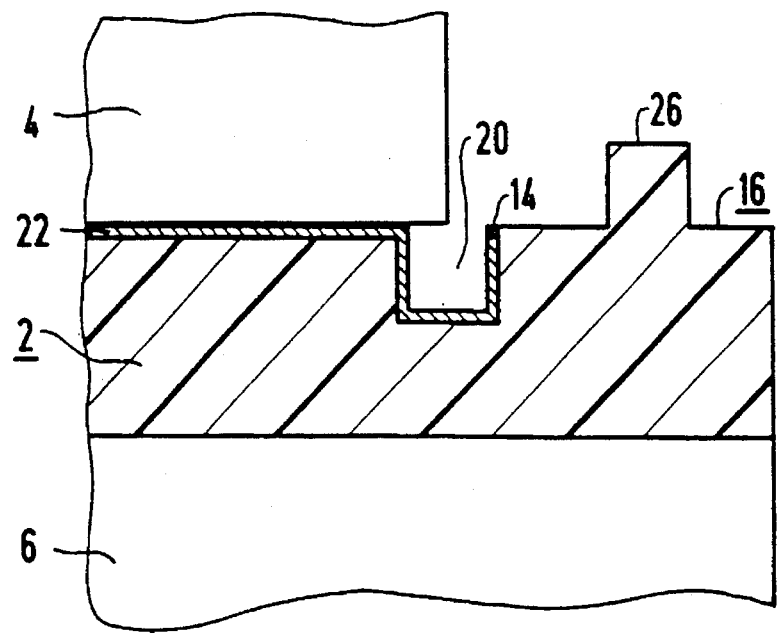

FIGS. 7 and 8 each show a further advantageous embodiment of the third insulating disk 2 shown in FIG. 4. In these embodiments, the edge region 16 is provided with at least one further circumferential groove 24 (FIG. 7) and with at least one circumferential rib 26 (FIG. 8). As a result of the fact that the insulating disk 2 is provided with a plurality of ribs 26 and/or a plurality of circumferential grooves 24 in the region 16 of the creepage paths, the value of the flashover voltage can advantageously be increased. An rms value of the flashover voltage of 10 kV/60 sec can thereby be achieved. The shape of the ribs 18 and 26 and of the groove 24 can be as desired. In order to be able to make full use of the insulating disk 2 electrically, an approximation of the cross-sectional areas of said ribs 18 and 26 and said groove 24 to the so-called Rogowski profile is to be recommended.

A further advantage of the insulating disk 2 in the surface embodiment shown in FIG. 1 or FIG. 3 is that the disk size decreases without affecting the flashover resistance.

We claim:

1. An insulating disk for arrangement between a semiconductor and a heat sink, the insulating disk:

being composed of electrically insulating and thermally conducting material; and having one side provided with a circumferential groove defining inner and outer walls, the walls being conductively coated, and the circumferential groove being disposed such that a cross-sectional area enclosed by the outer wall of the groove is larger than the cross-sectional area of a contact surface of at least one of the semiconductor and the heat sink.

2. The insulating disk of claim 1 wherein an area enclosed by the circumferential groove is coated with a further conductive layer, the further conductive layer being connected, in an electrically conducting manner, to the conductive layer of the groove.

3. The insulating disk of claim 1 wherein an edge region of the insulating disk is provided with at least one circumferential groove.

4. The insulating disk of claim 1 wherein an edge region of the insulating disk is provided with at least one circumferential rib.

5. The insulating disk of claim 1 wherein an edge region of the insulating disk is provided with at least one circumferential groove and at least one circumferential rib.

6. The insulating disk of claim 1 wherein an edge region of the insulating disk tapers towards an outer edge of the disk.

7. The insulating disk of claim 2 wherein an edge region of the insulating disk is provided with at least one circumferential groove.

8. The insulating disk of claim 2 wherein an edge region of the insulating disk is provided with at least one circumferential rib.

9. The insulating disk of claim 2 wherein an edge region of the insulating disk is provided with at least one circumferential groove and at least one circumferential rib.

* * * * *